US009571043B1

United States Patent
Lum et al.

(10) Patent No.: US 9,571,043 B1
(45) Date of Patent: Feb. 14, 2017

(54) AUXILIARY CONTROL OF SYSTEM OFFSETS

(71) Applicant: Avago Technologies General IP (Singapore) Pte. Ltd, Singapore (SG)

(72) Inventors: Richard Lum, Singapore (SG); Hui Fung Sim, Singapore (SG)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 14/872,328

(22) Filed: Oct. 1, 2015

(51) Int. Cl.
*H03F 1/02* (2006.01)
*H03F 1/30* (2006.01)
*H03F 3/45* (2006.01)

(52) U.S. Cl.
CPC ......... *H03F 1/303* (2013.01); *H03F 3/45071* (2013.01); *H03F 2200/153* (2013.01); *H03F 2200/156* (2013.01); *H03F 2203/45044* (2013.01); *H03F 2203/45288* (2013.01)

(58) Field of Classification Search
CPC .................................................. H03F 1/02
USPC ................................. 330/9; 327/124, 307
See application file for complete search history.

(56) References Cited

U.S. PATENT DOCUMENTS

| 5,606,320 | A | * | 2/1997 | Kleks | H03M 1/002 341/118 |
| 5,789,974 | A | * | 8/1998 | Ferguson, Jr. | H03F 1/304 330/2 |
| 6,806,745 | B2 | * | 10/2004 | Fujimoto | G11C 27/026 327/337 |
| 7,187,318 | B1 | | 3/2007 | Lee et al. | |
| 7,324,038 | B2 | | 1/2008 | van der Goes et al. | |
| 7,656,226 | B2 | * | 2/2010 | Johnson | H03H 19/004 330/9 |
| 7,944,287 | B2 | * | 5/2011 | Larson | H03F 3/45183 330/254 |
| 8,102,203 | B2 | * | 1/2012 | Drost | H03F 3/45973 330/9 |
| 8,698,663 | B2 | | 4/2014 | Smiley et al. | |

* cited by examiner

*Primary Examiner* — Henry Choe (57) ABSTRACT

An amplification system, circuit, and method of performing offset cancellation are described. The disclosed amplification system is described as including a main amplifier circuit that receives an input signal and produces an output signal, a two-phase output sampler, and an offset correction circuit. The two-phase output sample samples the output signal of the main amplifier circuit in two different clock domains and determines a delta between the samples. The delta is used to assist the offset correction circuit in generating an offset correction feedback for the main amplifier circuit.

20 Claims, 11 Drawing Sheets

AUXILIARY CONTROL OF SYSTEM OFFSETS

FIELD OF THE DISCLOSURE

The present disclosure is generally directed toward amplifier circuits and, in particular, toward offset control in amplifier circuits.

BACKGROUND

Input offsets of amplifiers in circuits such as Analog-to-Digital (ADC) and Digital-to-Analog (DAC), voltage amplifiers, sample-and-holds, etc., often limit the minimum resolutions of these circuits. It is, therefore, critical to cancel out these amplifiers' offset, when circuit accuracy is impacted by the magnitude of these input offsets (e.g., usual amplifier input offsets are in the order of 1~10 mV). At the same time, 1/f noise which is dominant at low frequencies will be concurrently reduced with input offset cancellation. This further improves circuit accuracy.

Two general categories of offset cancellation are already in use: (1) Chopper Stabilization and (2) Autozeroing. In chopper stabilization, a low pass filter is usually required at the output of these amplifiers to reduce the magnitude of the output swing caused by chopping.

Figure 1A:
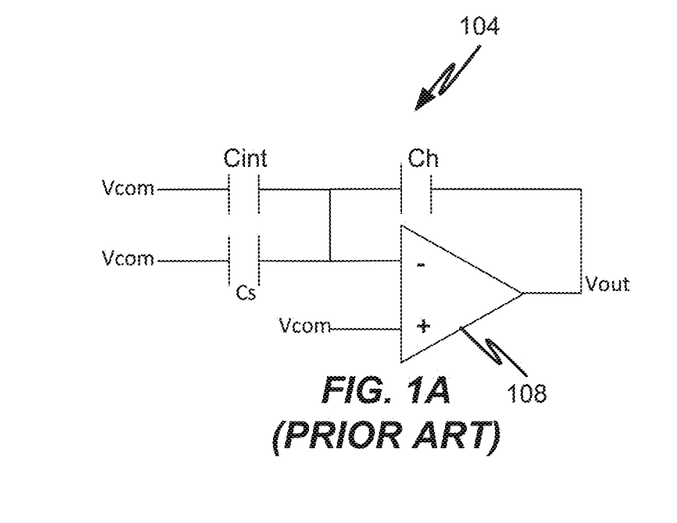
FIG. 1A is a circuit diagram depicting a single-ended output sample and hold DAC configuration in a hold mode of operation.
Figure 1B:
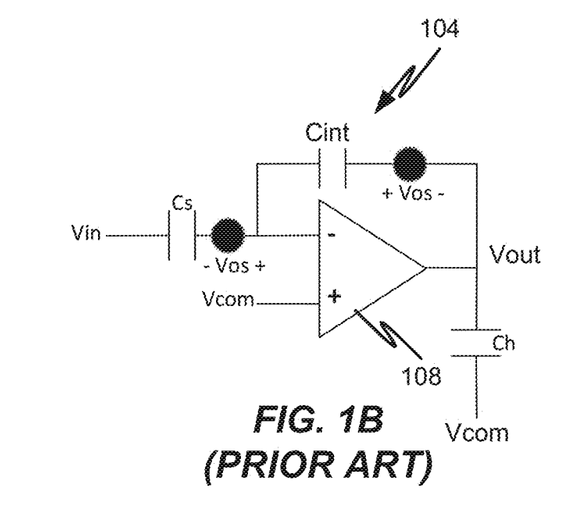
FIG. 1B is a circuit diagram depicting the single-ended output sample and hold DAC of FIG. 1A in a sample mode of operation.
Figure 1C:
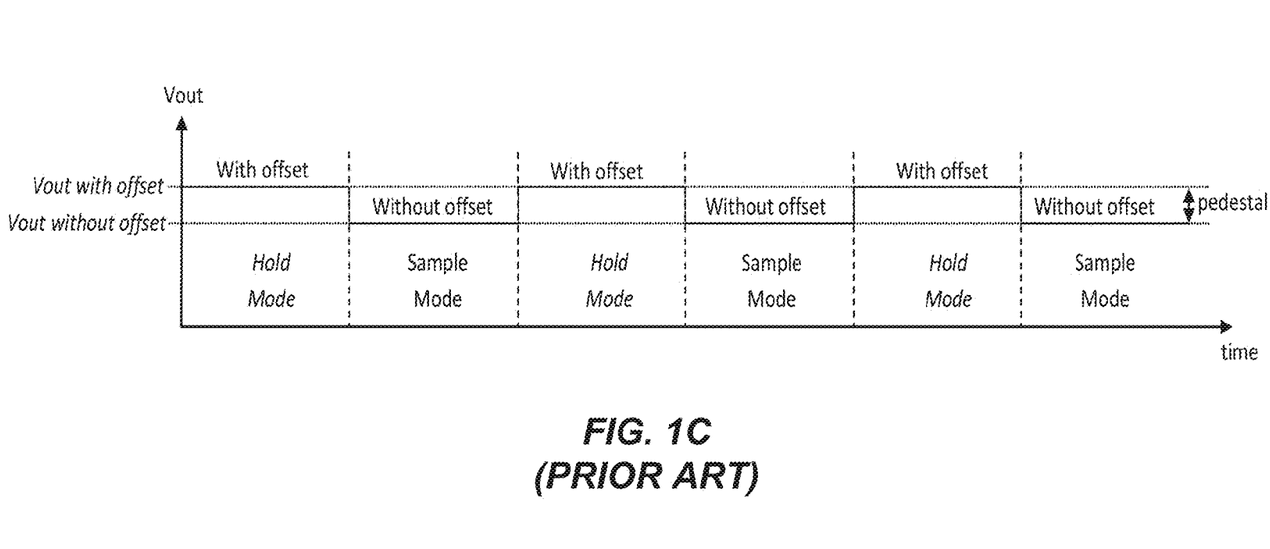
FIG. 1C is a waveform depicting Vout of the single-ended output sample and hold DAC of FIGS. 1A and 1B.

In single-ended output sample and hold DAC configuration, the DAC output is often not offset-free in both sample and hold modes, as illustrated in FIGS. 1A and 1B. FIG. 1A shows a single-ended output sample and hold DAC 104 in a hold mode of operation. During the hold mode of operation the offset of the amplifier 108 is stored on both the intermediate capacitor Cint and supply capacitor Cs. As shown in FIG. 1B, when the circuit 104 is in a sample mode of operation, the offset of the amplifier 108 is now cancelled out at output voltage Vout. The offset of the amplifier 108 is effectively null out in the output voltage Vout during the sample mode, but not in the hold mode. From FIG. 1B, it can be seen that the holding capacitor Ch stores the offset-nulled output voltage Vout with respect to the common voltage Vcom. Hence, the holding capacitor Ch does not contain the offset content of the amplifier 108. In the hold mode, the offset of the amplifier is not removed. This creates a pedestal in the output voltage Vout, as shown in FIG. 1C.

Additional errors due to charge injection upon switch turn off of the holding capacitor Ch adds to the pedestal in the output voltage Vout. In this structure of FIGS. 1A-C, offset present in the common voltage Vcom reference is doubled at the output voltage Vout. Furthermore, continuous chopper stabilization is not feasible for the depicted DAC structure because the chopper has to be disabled during the sample mode or else larger output offsets will be created. If chopper stabilization is also used on the common voltage Vcom reference, the total energy of the offset swing at the output voltage Vout could easily be on the order of +/−20 mV, which at a low output voltage Vout level (e.g., 50 mV) is approximately +/−40% of the output voltage Vout level. This offset is significantly large and could easily result in the output voltage Vout inaccuracies due to imperfections such as uneven up/down slew profiles of offset swings.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular circuit elements illustrated and described herein but are to include deviations in circuits and functionally-equivalent circuit components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It is with respect to the above-described shortcomings of DAC circuits that embodiments of the present disclosure were contemplated. In some embodiments, an offset cancellation method and system are disclosed. While embodiments of the present disclosure will be described in connection with a particular configuration of an amplifier circuit, it should be appreciated that the claims are not so limited. Indeed, embodiments of the present disclosure can be utilized to improve the capabilities of any circuit having offset issues such as amplifier circuits. More specific examples of the types of amplifier circuits that may benefit from the disclosed two-phase offset method and system include, without limitation, ADC circuits, DAC circuits, voltage amplifiers, sample-and-hold circuits, and combinations thereof.

Figure 2:
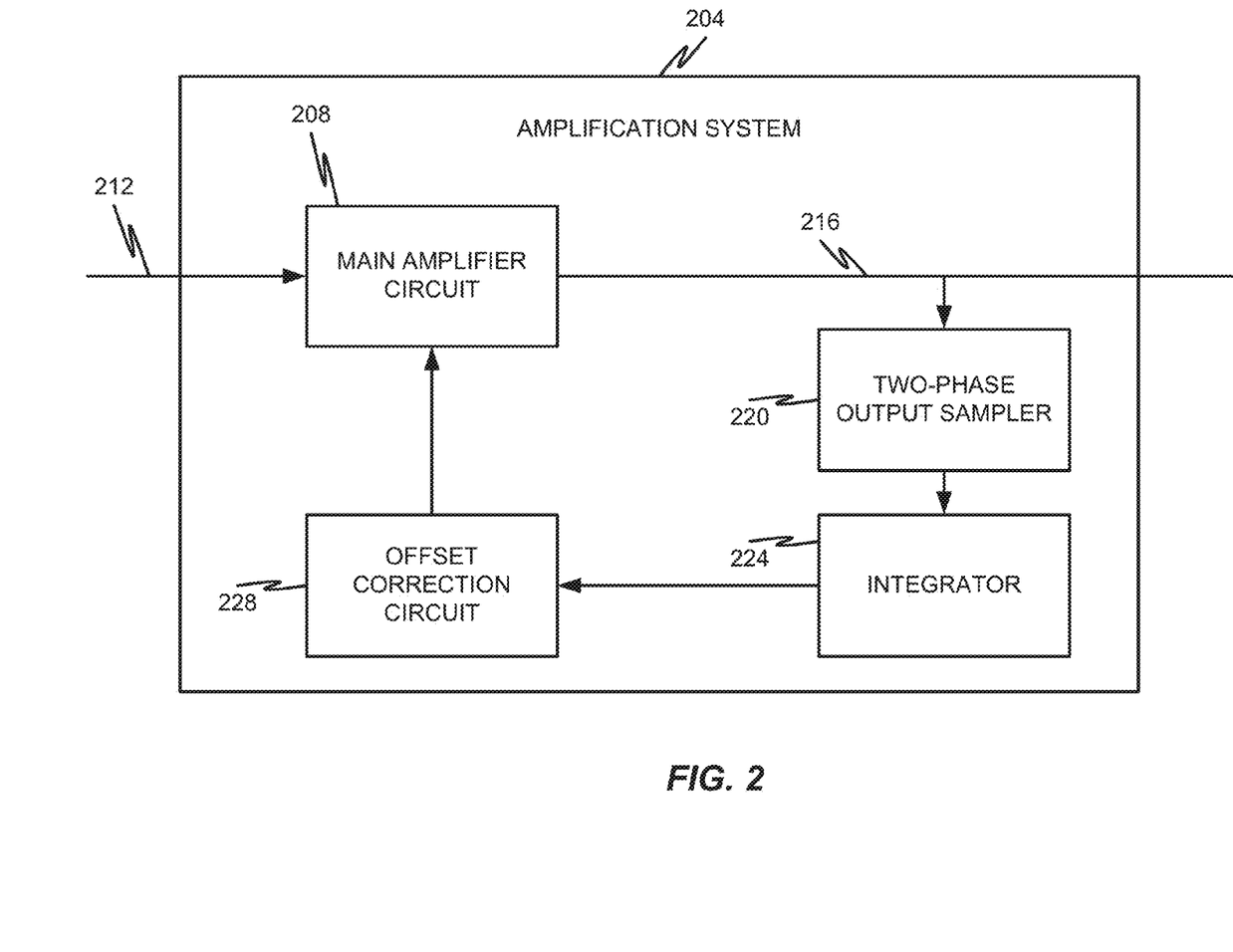
FIG. 2 is a schematic block diagram depicting an amplification system in accordance with embodiments of the present disclosure.

Referring now to FIGS. 2-8, various methods, systems, and circuits will be described for addressing the offset issues explained hereinabove. With reference initially to FIG. 2, an amplification system 204 is depicted as including a main amplifier circuit 208, a two-phase output sampler 220, an integrator 224, and an offset correction circuit 228. The amplification system 204 receives an input signal 212 at the main amplifier circuit 208. The input signal 212 may be an analog input signal, digital input signal, or the like.

The main amplifier circuit 208 passes the input signal 212 through its circuit components and produces an output signal 216. The output signal 216 may correspond to an amplified version of the input signal 212, a digital version of the input signal 212, an analog version of the input signal 212, or the like.

The output signal 216 is also sampled by the two-phase output sampler 220, which samples the output signal 216 over two different clock phases $\phi 1$ and $\phi 2$. The two-phase output sampler 220 is further configured to obtain or determine a difference in the output signal 216 for the two clock phases. This delta or difference is then integrated over time by the integrator 224. The output of the integrator 224 is provided to the offset correction circuit 228 in a feedback loop to the main amplifier circuit 208, thereby allowing the integration of the delta to correct the main amplifier circuits 208 offset. By removing or reducing the amplifier offset in the main amplifier circuit 208, the pedestal in the output voltage Vout (one example of the output signal 216) will be correspondingly reduced. In some embodiments, the clock phases $\phi 1$ and $\phi 2$ are synchronized with the main amplifier circuit's 208 sample and hold modes, respectively. In this way, error amplifier offset storage occurs during the circuit's 208 sample mode, when the output voltage Vout of the amplifier circuit 208 has been offset-nulled; and when the circuit 208 goes into the hold mode of operation, which is when the amplifier offset is present at the output voltage Vout, the error amplifier goes into operation to cancel out the circuit's 208 amplifier offset, thereby removing the pedestal in the output voltage Vout.

Figure 3:
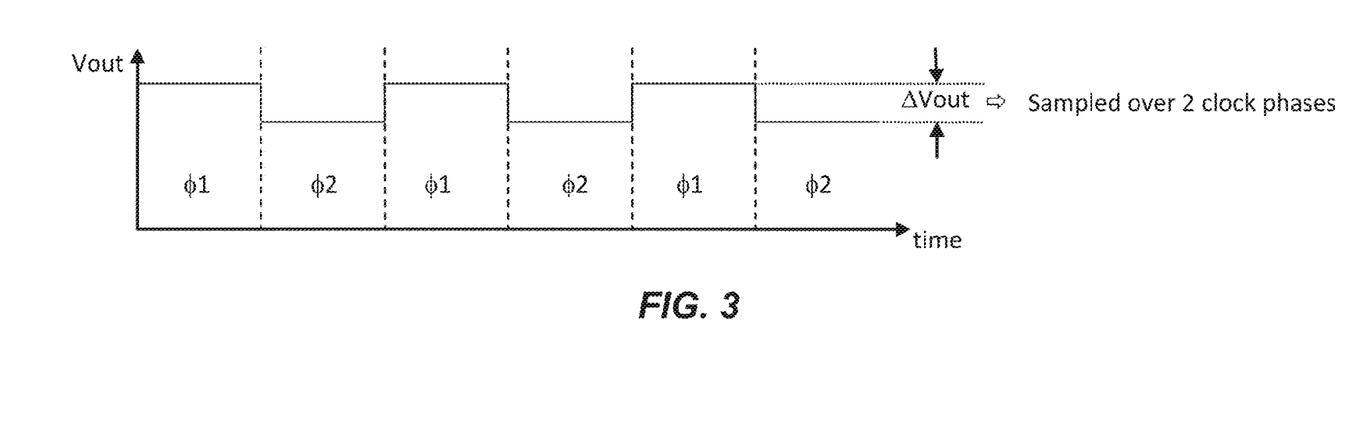
FIG. 3 is a waveform depicting operations of a circuit in accordance with embodiments of the present disclosure.

FIG. 3 shows how the operation of the two-phase output sampler 220 is able to sample the main amplifier circuit's 208 output 216 (e.g., the output voltage Vout) over two different clock phases $\phi 1$ and $\phi 2$. In embodiments where the main amplifier circuit 208 correspond to a sample-and-hold DAC, the feedback control loop of the two-phase output sampler 220, integrator 224, and offset correction circuit 228 works to close the gap between the sample and hold states of the DAC. This is done by using the feedback control loop to compare the output 216 over the two different phases $\phi 1$ and $\phi 2$. In other words, the amplifier circuit's 208 output offset is obtained over two different time domains $\phi 1$ and $\phi 2$. Prior art system worked to offset-null (e.g., reduce or eliminate offset) by storing the offset in a single time domain and then trying to cancel in the next time domain, based on the offset stored from the previous clock domain. This single domain approach is not particularly effective to reduce or remove the offset in many types of amplification systems 204.

Figure 4:
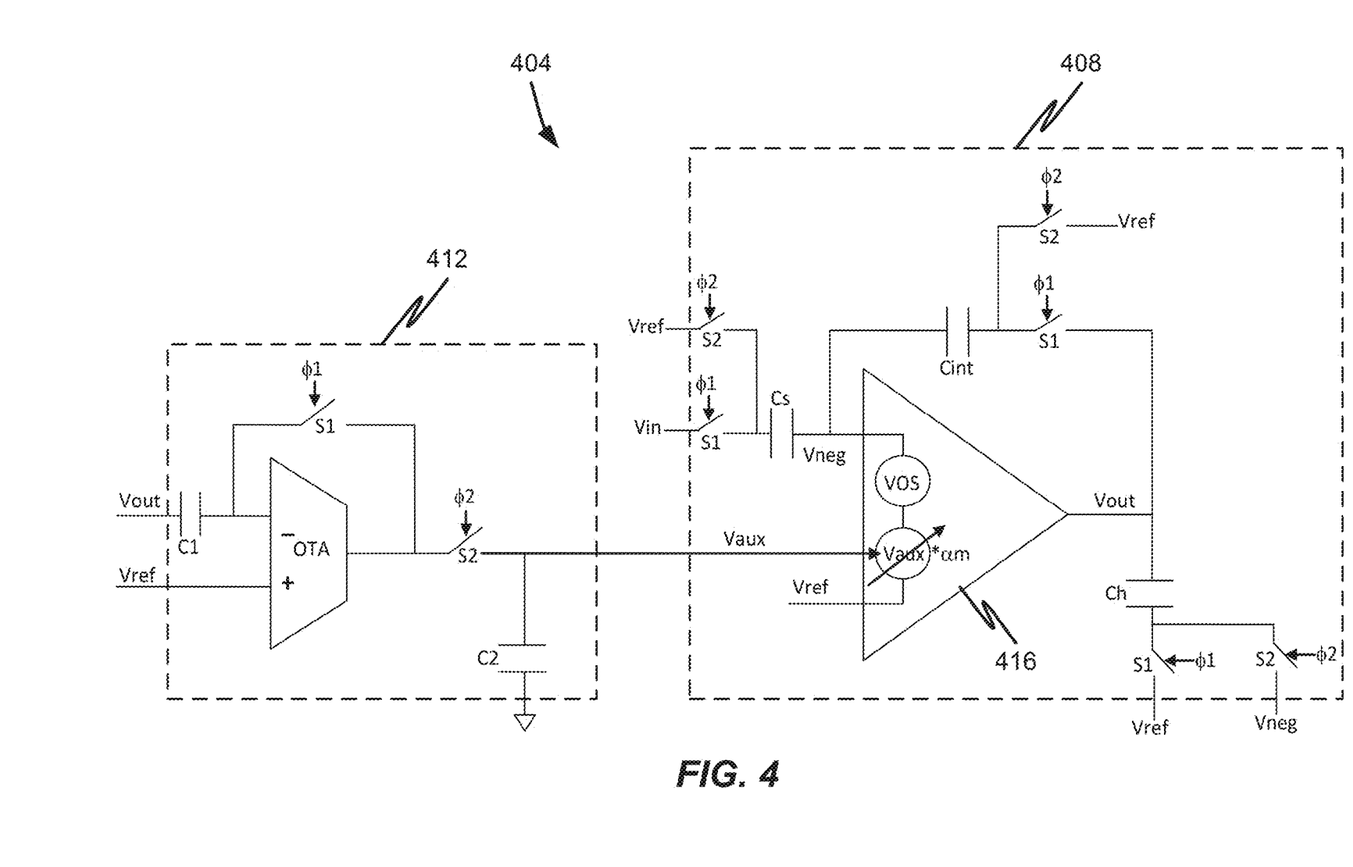
FIG. 4 is a circuit diagram depicting details of an amplification and offset cancellation circuit in accordance with embodiments of the present disclosure.

With reference now to FIG. 4, a first example of an amplification and offset cancellation circuit 400 will be described in accordance with at least some embodiments of the present disclosure. The circuit 400 is shown to include an amplification module 408 and an offset correction module 412. The amplification module 408 may correspond to an example of the main amplifier circuit 208. Accordingly, the amplification module 408 may comprise an amplifier 416 for amplifying input signals provided thereto. Similarly, the offset correction module 412 may correspond to an example of the feedback control loop. As such, the offset correction module 412 may include one, some, or all of the two-phase output sampler 220, the integrator 224, and the offset correction circuit 228. As compared to the amplification module 408, the offset correction module 412 may comprise an Operational Transconductance Amplifier (OTA) whose differential input voltage produces an auxiliary output Vaux. The OTA may be referred to herein as an auxiliary amplifier capable of switching modes of operation during the different time domains. During the time domain where the amplification module 408 is in a hold mode, the auxiliary amplifier may be considered an error amplifier. When the amplification module 408 is in a sample mode, the auxiliary amplifier may be considered a unity feedback amplifier. The auxiliary output Vaux is provided as an input back to the amplifier 416 of the amplification module 408. The inputs to the OTA include the output voltage Vout of the amplifier 416 as well as the reference voltage Vref. A first capacitor C1 may be provided between the negative input of the OTA and the output voltage Vout of the amplifier 416.

During a first clock phase $\phi 1$ the first switches S1 (in both modules 408, 412) may be in an ON or closed position whereas the second switches S2 (in both modules 408, 412) may be in an OFF or open position. The OTA mode during this first clock phase $\phi 1$ can be considered a unity feedback mode and the OTA is producing an OTA offset. This causes the first capacitor C1 to store voltage that is approximately equal to the output voltage during the first clock phase Vout($\phi 1$) plus the OTA offset (e.g., voltage across C1=Vout($\phi 1$)+OTA offset). Also during this first clock phase $\phi 1$ the second capacitor C2 positioned between the amplification module 408 and the offset correction module 412 stores the last auxiliary output Vaux measured during the previous clock phase (e.g., immediately previous second clock phase $\phi 2$). In this embodiment, the amplification module 408, if operating as a sample-and-hold DAC, may be considered to be in a sample mode of operation.

During the second clock phase $\phi 2$ the first switches S1 may switch to an OFF or open position whereas the second switches S2 may switch to an ON or closed position. The OTA mode during this second clock phase $\phi 2$ can be considered an error amplification mode of operation and the OTA is producing an output approximately equal to Vout($\phi 2$) minus Vout($\phi 1$). This OTA output causes the first capacitor C1 to discharge and then the second capacitor C2 stores the current auxiliary output Vaux during the second clock phase φ2. This operation also removes the offset of the OTA. In this embodiment, the amplification module 408, if operating as a sample-and-hold DAC, may be considered to be in a hold mode of operation.

Figure 5A:
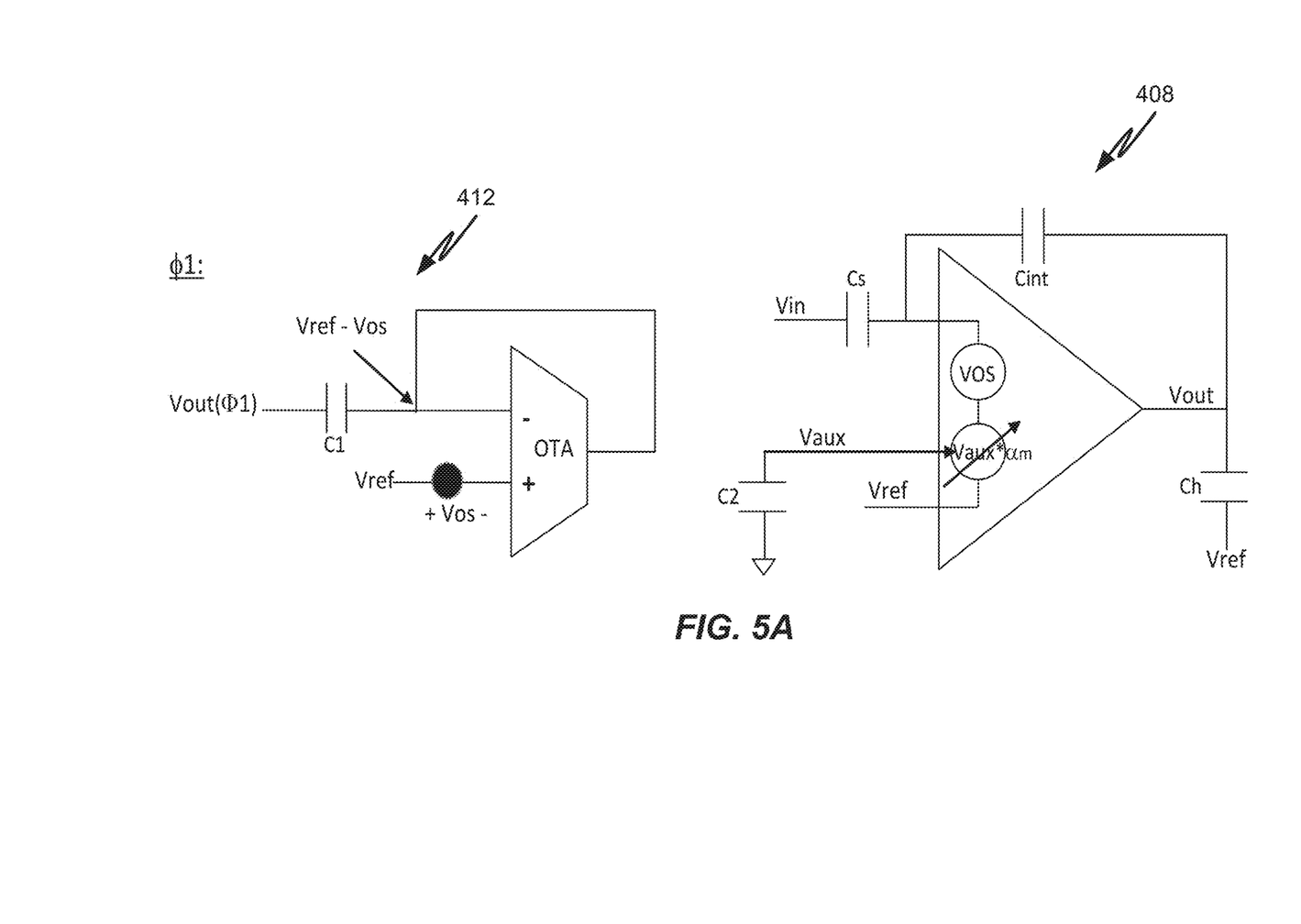
FIG. 5A is a circuit diagram depicting a configuration of the circuit depicted in FIG. 4 during a first clock phase in accordance with embodiments of the present disclosure.

With reference now to FIGS. 5A and 5B additional details of the circuit 400 operation during the first and second clock phases φ1 and φ2 will be described in accordance with at least some embodiments of the present disclosure. FIG. 5A shows the circuit 400 during the first clock phase φ1. It can be seen that the amplification module 408 is disconnected from the offset feedback module 412 during the first clock phase φ1. It can also be seen that the OTA is configured as a unity feedback amplifier to allow for the OTA offset storage to be kept at the first capacitor C1. The amplifier's output Vout (which is offset-free) is also sampled concurrently by the OTA with respect to the reference voltage Vref. This causes the first capacitor C1 to store a charge of approximately (C1*[Vout(φ1)−Vref+Vos(OTA)]), where Vos is the offset voltage of the OTA.

Figure 5B:
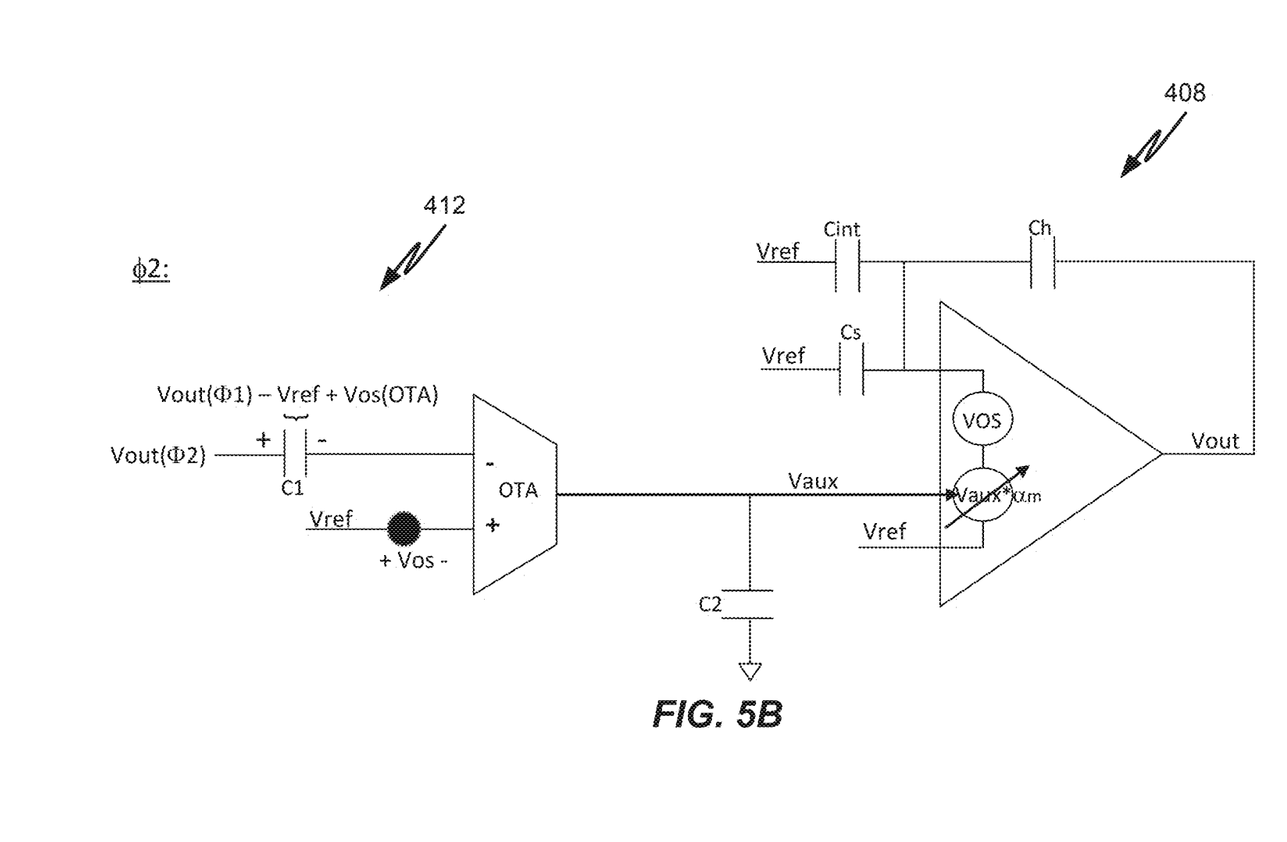
FIG. 5B is a circuit diagram depicting a configuration of the circuit depicted in FIG. 4 during a second clock phase in accordance with embodiments of the present disclosure.

FIG. 5B shows the circuit 400 during the second clock phase φ2. It can be seen that during the second clock phase φ2 the amplification module 408 is connected to the offset feedback module 412. In particular, the output of the OTA is provided as an input to the amplifier 416. During this clock phase φ2, the unity feedback is removed from the OTA and now the OTA is configured as a transconductance error amplifier. The amplifier 416 of the amplification module 408 now has its output Vout sampled and the difference seen by the OTA input is approximately equal to: (Vref−Vos)−{Vout (φ2)−[Vout(φ1)−Vref+Vos(OTA)]}=Vout(φ2)−Vout(φ1). The error amplifier now provides an error voltage based on the difference in the output voltage Vout over the two clock phases φ1 and φ2 independent of the error amplifier's offset. The error voltage then goes into an auxiliary amplifier within the amplifier 416 to adjust the input offset to the amplifier 416. In this mode, the entire system is now in a closed-loop configuration.

In some embodiments, the auxiliary input Vaux provided to the amplifier 416 will see an input level Vaux that is approximately Vos(DAC)×[gm(DAC)/gm(aux)], where gm(DAC) corresponds to the transconductance of the amplifier 416 and gm(aux) corresponds to the transconductance of the OTA when operating as the auxiliary amplifier. The auxiliary input Vaux will reach above level in a Δt=Vos (DAC)/{[gm(error amp)/C2]×[Vout(Φ2)−Vout(Φ1)]×[gm (aux)/gm(DAC)]}. The transconductance gm of the auxiliary amplifier (e.g., the OTA) is made much smaller (e.g., ten times smaller) than the amplifier's 416 transconductance to ensure that the auxiliary input does not significantly reduce the transconductance of the amplifier 416, thereby degrading the amplifier's 416 loop-gain. Having the transconductance of the auxiliary amplifier smaller than the transconductance of the amplifier 416 also decreases the sensitivity of the auxiliary amplifier from input noise. The ratio of the amplifier's 416 transconductance to the auxiliary amplifier's transconductance also contributes to the overall steady state error in the output voltage Vout as shown in Table 2 below, where it should be noted that the Voffs(DAC) is approximately the effective offset stored in capacitors Cs, Cint or effective offset stored during the DAC self-nulling phase/hold phase.

Offset in the auxiliary amplifier is naturally cancelled through the same auxiliary offset cancellation loop. This occurs because any offset present in the auxiliary amplifier would present itself as offset in the amplifier 416, scaled by a factor of $\alpha_m$ (ratio of DAC amplifier to auxiliary amplifier Gm). The total offset at the input of the amplifier 416 before nulling would be approximately equal to Vos(DAC)−{Vos (aux)×[gm(aux)/gm(main)]}. An illustration of the correction process is shown in Table 1 below, assuming that the auxiliary input Vaux begins at an incorrect level Vaux(0), with a pre-existing charge in Cs and Cint, which results in an erroneous output voltage Vout in the first sample mode of (V01−ΔVe):

TABLE 1

Illustrative Offset Correction Process

| DAC Mode | Hold | Sample | Hold | Sample | Hold | Sample |
|---|---|---|---|---|---|---|
| OTA Mode | Error Amp | Unity Feedback | Error Amp | Unity Feedback | Error Amp | Unity Feedback |
| Vout | <Don't Care> | Vo1 − ΔVe | Vo1 − ΔVe | Vo1 | Vo1 | Vo1 |
| Vaux | <Don't Care> | Vaux(0) | Vaux(0) → Vaux(1) = $\alpha_m$ * Vos(DAC) | Vaux(1) | Vaux(1) | Vaux(1) |
| Voffs(DAC) | ΔVe/2 + [Vos(DAC) − Vaux(0) * $\alpha_m$] | N.A. | 0 | N.A. | 0 | N.A. |

One of the major sources of error to the nulling system is the delta change in charge stored in the first capacitor C1, when the OTA amplifier switches over from a unity gain amplifier to an error amplifier, due to a combination of MOS switch charge injection, sampled noise, and leakage current. To reduce the level of charge injection, a dummy switch that is switched in opposite phases from the error amplifier's unity feedback switch is connected to the negative terminal of the error amplifier. The other source of error is the delta change in charge stored on the second capacitor C2, when the holding capacitor Ch disconnects from the output of the error amplifier, thereby allowing the error amplifier to perform its own offset storage plus sampling of the amplifier 416 output Vout during the DAC hold mode. The steady-state error in the Vout pedestal and absolute Vout level are shown in Table 2 below.

TABLE 2

Steady-State Error During DAC Hold Mode

| DAC Mode | Hold | Sample | Hold | Sample | Hold | Sample |
|---|---|---|---|---|---|---|
| OTA Mode | Error Amp | Unity Feedback | Error Amp | Unity Feedback | Error Amp | Unity Feedback |
| Vout | <Don't Care> | Vo1 − ΔVe | Vo1 − ΔVe + ΔVo1 | Vo1 + ΔVaux/$\alpha_m$ | Vo1 + ΔVo1 + ΔVaux/$\alpha_m$ | Vo1 + ΔVaux/$\alpha_m$ |
| Vaux | <Don't Care> | Vaux(0) | Vaux(0) → Vaux(1) = $\alpha_m$[Vos(DAC) − ΔVo1] | Vaux(1) + ΔVaux | Vaux(1) + ΔVaux → Vaux(2) = $\alpha_m$[Vos(DAC) − ΔVo1] | Vaux(2) + ΔVaux |
| Voffs(DAC) | ΔVe/2 + [Vos(DAC) − Vaux(0) * $\alpha_m$] | N.A. | ΔVo1 | N.A. | ΔVo1 | N.A. |

Charge storage deltas in the second capacitor C2 can be seen to contribute to a steady-state error in the absolute level of the amplification module's 408 output, Vo1, while delta changes in the first capacitor C1 limit the pedestal error correction. Close to minimum size switches (w/l=1.2 u/0.5 u) are used to minimize leakage levels. Dummy switches as described above can be employed. A larger am would also counter the effects of charge injection at the second capacitor C2. Capacitors C1 and C2 are sized to give overall pedestal and absolute level errors of acceptable range. Pedestal errors are kept well within 1 mV across corners, while absolute level errors can be maintained within approximately LSB/4 level. For a minimum reference voltage Vref of 2V, at 10-bit output resolution, the LSB/4 would be approximately 488 uV. In such an illustrative system, the capacitors C1 and C2 could be silicon-implementable, at 4 pF and 8 pF, respectively, to fulfill the above steady-state error requirements, at a DAC sample and hold rate of approximately 70 kHz.

Figure 6A:
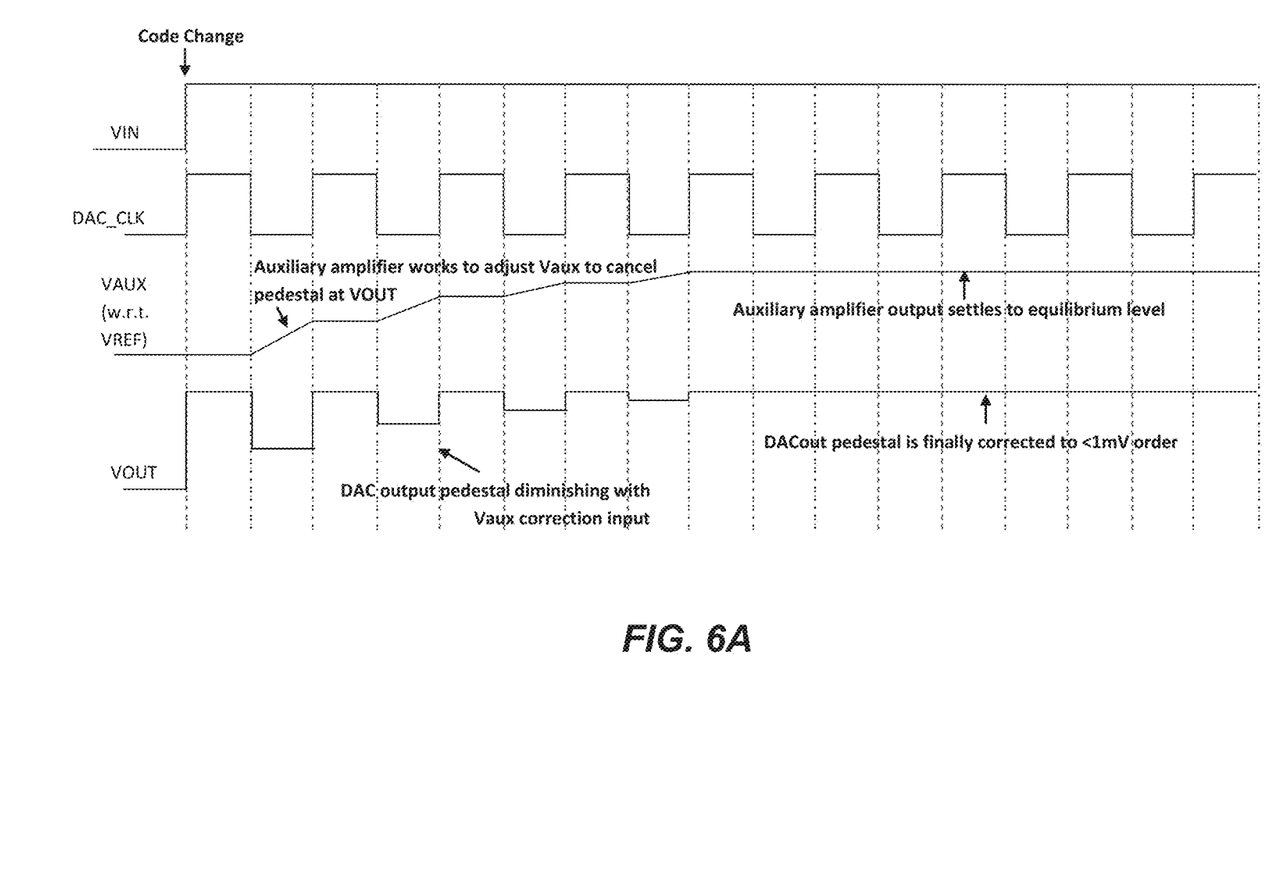
FIG. 6A illustrates the auxiliary offset cancellation effects on the Vout pedestal in accordance with embodiments of the present disclosure.

FIG. 6A illustrates the auxiliary offset cancellation effects on the Vout pedestal in accordance with at least some embodiments of the present disclosure. As shown in FIG. 6A, when a code change occurs at the input voltage Vin, the auxiliary amplifier works to adjust the Vaux to cancel the pedestal at Vout. Eventually (e.g., after about four clock cycles or so), then auxiliary amplifier output settles to an equilibrium level and the Voffs(DAC) pedestal is finally corrected to less than <1 mV.

Figure 6B:
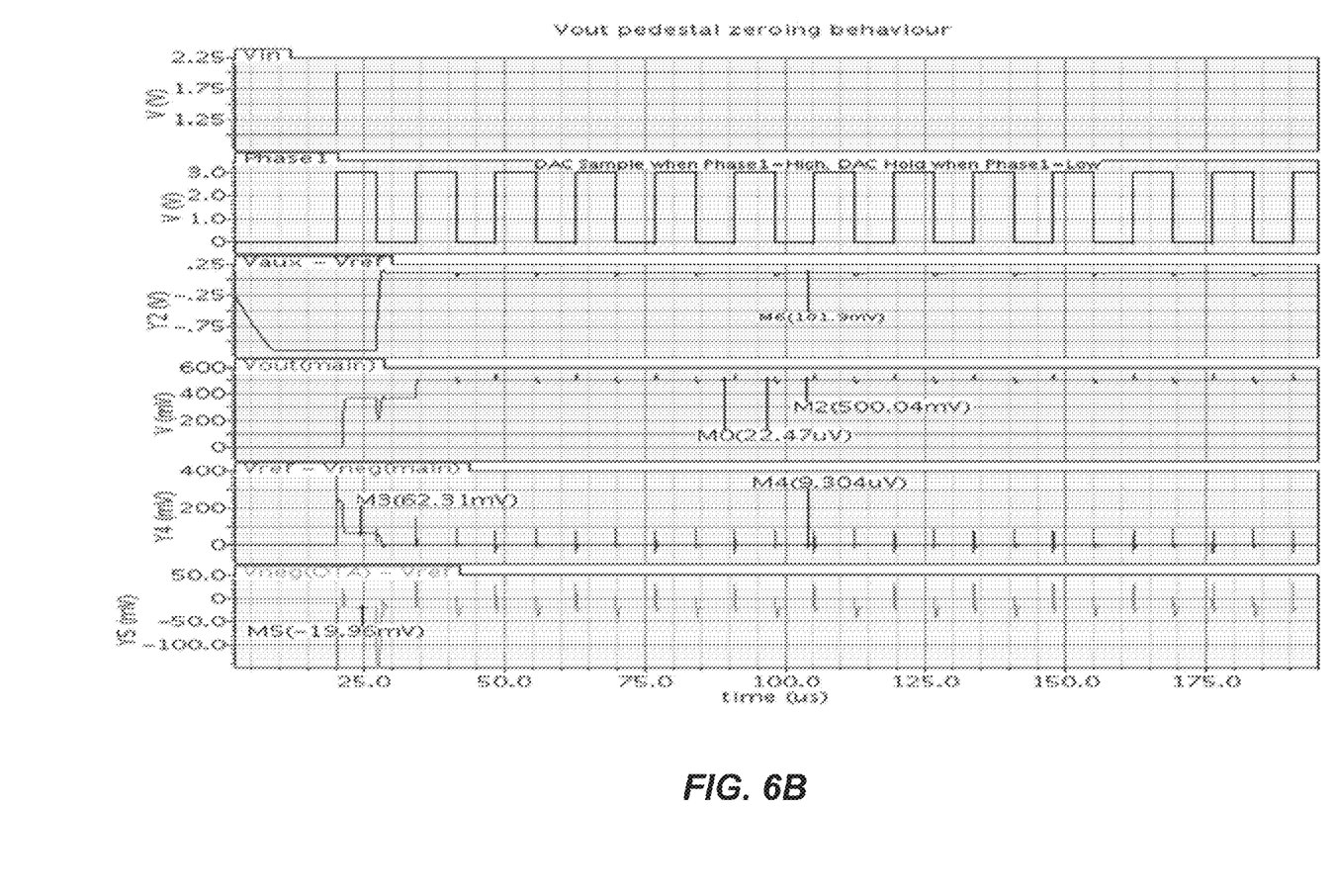
FIG. 6B depicts a plurality of waveforms for the circuit of in FIG. 4 during its operation.

An actual simulation result showing a zeroing in the Vout pedestal with an artificially added 20 mV offset in the DAC amplifier input, 20 mV offset in the auxiliary amplifier input and 20 mV offset in the OTA input is shown in FIG. 6B. As can be seen in FIG. 6B and as discussed herein, the utilization of a two-phase sampling easily ensures at least one order of reduction in the output pedestal as compared to prior art system that utilize offset-nulling on only one phase (e.g., 10 mV pedestal can be reduced to less than 1 mV). This offset removal is beneficial for any code of a DAC. Accordingly, the output of a DAC is now: (1) offset-free on both clock phases Φ1 and Φ2; (2) directly interfaceable to a continuous time-succeeding state without a post filter stage for discrete (due to pedestal) to continuous time; and (3) clock phase noise is suppressed, thereby relaxing the post-filtering requirements of the DAC.

The scheme described in connection with FIGS. 2-5B is applicable to all switched capacitor systems, wherever there is a conversion of the discrete time system to a continuous time system. Such switched capacitor systems are most likely to adopt a sample and hold architecture, where any errors in the phases need to be filtered out. Making this offset error small or negligible will reduce the filtering requirements and suppress out-of-band noise with simpler filter structures.

Figure 7:
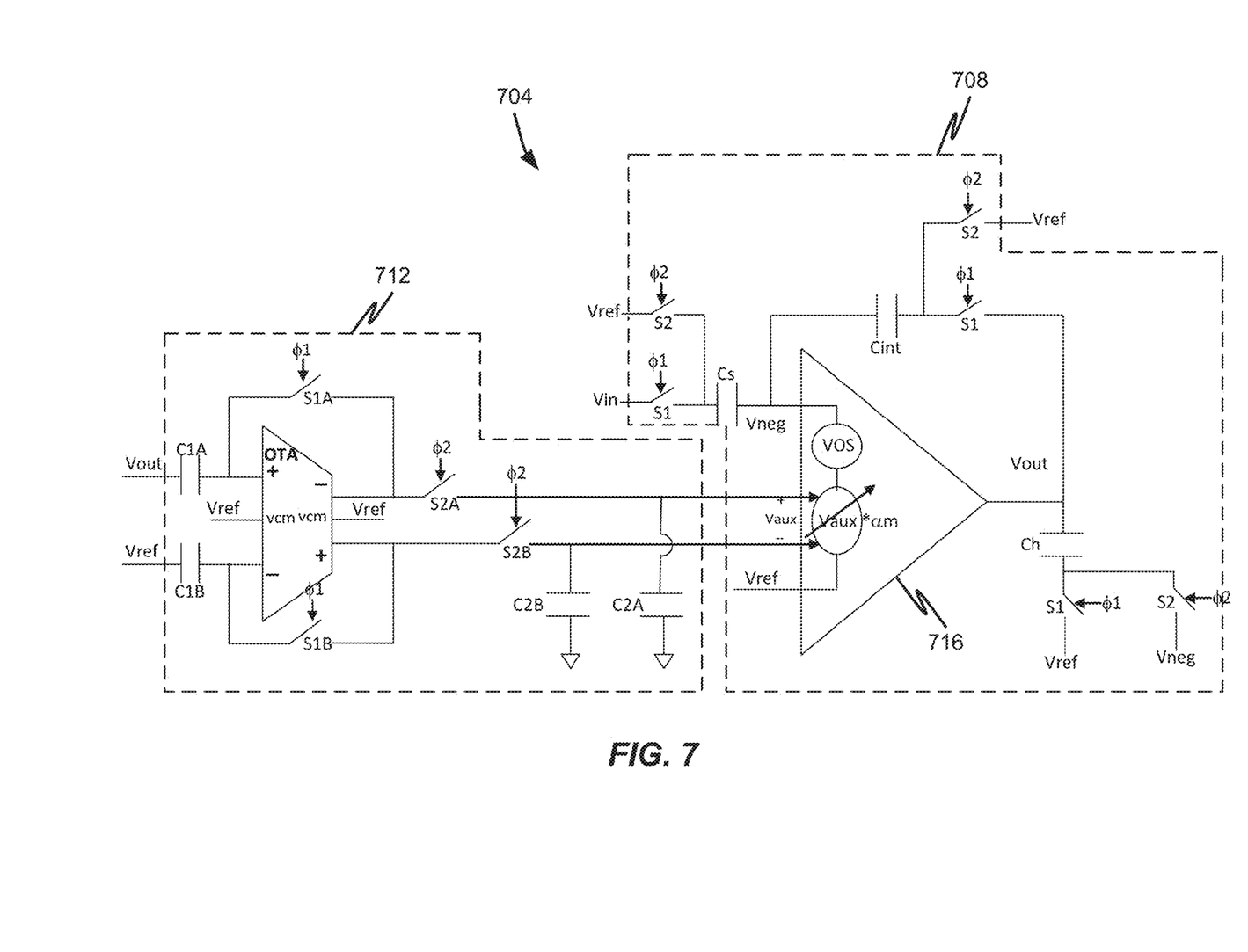
FIG. 7 is a circuit diagram depicting details of another amplification and offset cancellation circuit in accordance with embodiments of the present disclosure.

With reference now to FIG. 7, a second example of an amplification and offset cancellation circuit 700 will be described in accordance with at least some embodiments of the present disclosure. The circuit 700 is shown to include an amplification module 708 and an offset correction module 712. The amplification module 708 may correspond to another example of the main amplifier circuit 208. Accordingly, the amplification module 708 may comprise an amplifier 716 for amplifying input signals provided thereto. Similarly, the offset correction module 712 may correspond to an example of the feedback control loop. As such, the offset correction module 712 may include one, some, or all of the two-phase output sampler 220, the integrator 224, and the offset correction circuit 228. As compared to the amplification module 708, the offset correction module 712 may comprise an Operational Transconductance Amplifier (OTA) that is configured to operate in a differential mode to further reduce the charge injection effects on the first and second capacitors C1 and C2, respectively. The OTA may be referred to herein as an auxiliary amplifier capable of switching modes of operation during the different time domains. During the time domain where the amplification module 708 is in a hold mode, the auxiliary amplifier may be considered an error amplifier. When the amplification module 708 is in a sample mode, the auxiliary amplifier may be considered a unity feedback amplifier.

Theoretically, capacitors C2A and C2B could have been replaced by a single capacitor across the differential outputs of the OTA. However, unlike the single capacitor configuration, the supply rejection of the auxiliary voltage is dependent on the supply rejection of the common mode voltage, unlike in a double capacitor configuration, where the two capacitors to ground naturally keep the auxiliary voltage ground-referenced, thereby causing the circuit 704 to be less sensitive to ground variations. In FIG. 7 it can be seen that a double set of C1 (e.g., C1A and C1B) are utilized. Due to the OTA's differential mode configurations, which desensitizes capacitors C1A, C1B, C2A, and C2B from charge injection, the smaller individual capacitors become possible to utilize.

Charge injection at capacitors C1A/C1B occurs when switches S1A/S1B go from ON or closed to OFF or open. For the same switch sizes the same delta charge is injected into capacitor C1A and capacitor C1B, hence creating the same ΔV error on both capacitor C1A and capacitor C1B. The same is true with respect to capacitor C2A and capacitor C2B when switches S2A/S2B go from ON to OFF. Given the differential nature of the configuration, the ΔV error on capacitors C1A and C1B cancel out each other and is no longer visible on the differential input voltage seen by the OTA. Again, because the differential output of the OTA is used as the auxiliary input for amplifier 716 offset cancellation, it is immune to the ΔV error on C2A and C2B.

Figure 8:
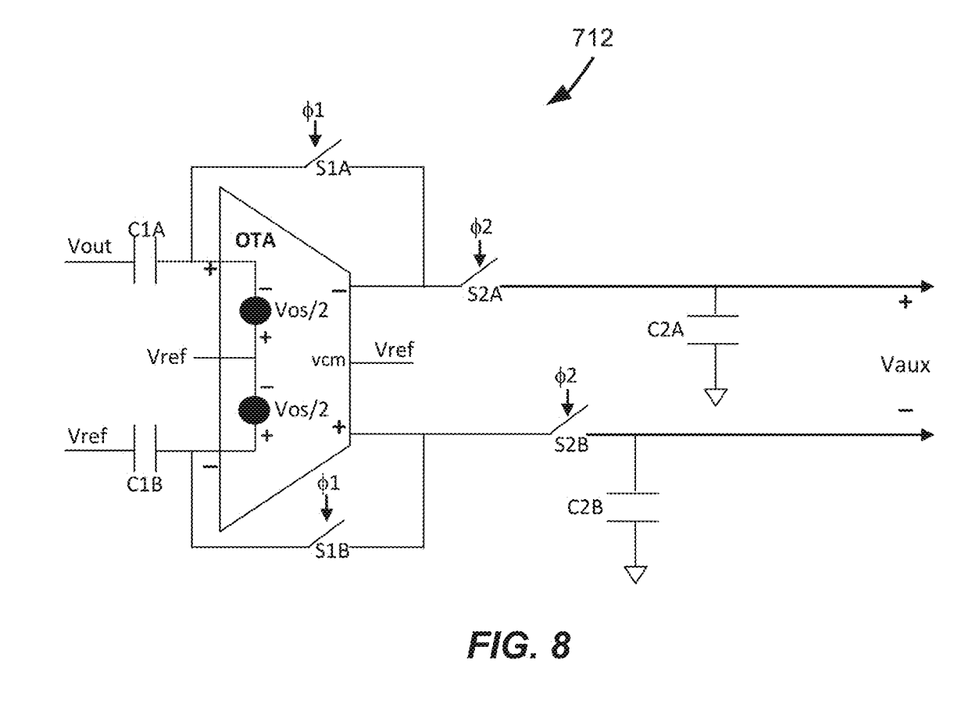
FIG. 8 is a circuit diagram depicting details of a portion of the circuit depicted in FIG. 7 in accordance with embodiments of the present disclosure.

FIG. 8 shows a configuration of the offset correction module 712 during the clock phase Φ1. As can be seen in FIG. 8, the voltage stored across the capacitor C1A approximately equals Vout(Φ1)−Vref+Vos/2. The voltage stored across capacitor C1B approximately equals−Vos/2. During the second clock phase Φ2, the OTA will see a differential voltage of Vout(ϕ2)−Voltage stored across C1A+Vos/2−(Vref−Voltage stored across C1B−Vos/2), which can be simplified to Vout(ϕ2)−Vout(ϕ1).

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:
an amplification module comprising an amplifier that receives an input signal and provides an amplified output signal, the amplification module operating in two different modes of operation during two different clock phases, respectively; and
an offset correction module that samples the amplified output signal of the amplification module during each of the two different clock phases to determine an offset behavior of the amplification module during the two different clock phases and provide an offset correction feedback to the amplification module based on the sampled output signal during each of the two different clock phases.

2. The circuit of claim 1, wherein the amplification module operates in a sample mode and a hold mode and wherein the offset correction module samples the amplified output signal of the amplification module during both the sample mode and the hold mode.

3. The circuit of claim 1, further comprising at least one switch that selectively couples and decouples the offset correction module and the amplification module.

4. The circuit of claim 3, wherein the at least one switch is in an ON state during a first clock phase of the two different clock phases and the at least one switch is in an OFF state during a second clock phase of the two different clock phases, wherein the at least one switch carries the offset correction feedback to the amplification module during the first clock phase, and wherein the at least one switch prohibits the offset correction feedback from being provided to the amplification module during the second clock phase.

5. The circuit of claim 4, wherein the offset correction module comprises at least one capacitor that stores a charge during the second clock phase and releases the stored charge during the first clock phase as part of the offset correction feedback.

6. The circuit of claim 5, wherein the offset correction module comprises an Operational Transconductance Amplifier (OTA) that receives the amplified output signal during each of the two different clock phases, compares the amplified output signal to a reference voltage, and produces an auxiliary output, wherein the auxiliary output is passed to an amplifier of the amplification module during the first clock phase, and wherein the auxiliary output is used to charge the at least one capacitor during the second clock phase.

7. The circuit of claim 6, wherein the OTA switches between different modes of operation during the two different clock phases.

8. The circuit of claim 7, wherein the OTA operates as an error amplifier while the amplification module is in a hold mode and wherein the OTA operates as a unity feedback amplifier while the amplification module is in a sample mode.

9. The circuit of claim 1, wherein the offset correction module comprises a two-phase output sample that is able to sample the amplified output signal over the two different clock phases, compare the sampled output between the two different clock phases to obtain an output delta, integrate the output delta to obtain an integrated output delta, and then incorporate the integrated output delta as part of the offset correction feedback that is provided back to the amplification module.

10. The circuit of claim 1, wherein the amplified output signal comprises an output voltage.

11. The circuit of claim 1, wherein the amplification module comprises at least one of a Digital-to-Analog Converter (DAC), an Analog-to-Digital Converter (ADC), a sample-and-hold circuit, and a voltage amplifier.

12. An amplification system, comprising:
a main amplifier circuit that receives an input signal and produces an output signal, the main amplifier circuit being configured to operate in a first mode during a first clock phase and a second mode during a second clock phase;
a two-phase output sampler that samples the output signal of the main amplifier circuit during the first clock phase and during the second clock phase and determines a delta between the sample of the output signal during the first clock phase and the sample of the output signal during the second clock phase; and
an offset correction circuit that provides an offset correction feedback to the main amplifier circuit based on the determined delta.

13. The amplification system of claim 12, wherein the main amplifier circuit operates in a sample mode during the first clock phase and a hold mode in the second clock phase.

14. The amplification system of claim 12, further comprising an integrator that integrates the delta and provides results of the integrated delta to the offset correction circuit.

15. The amplification system of claim 12, wherein the offset correction feedback comprises an auxiliary voltage produced by an Operational Transconductance Amplifier (OTA) based on a comparison of the output signal with a reference voltage.

16. The amplification system of claim 15, wherein the OTA switches modes of operation between the first clock phase and the second clock phase.

17. The amplification system of claim 16, wherein the OTA operates as an error amplifier while the main amplifier circuit is in a hold mode and wherein the OTA operates as a unity feedback amplifier while the main amplifier circuit is in a sample mode.

18. The amplification system of claim 12, further comprising at least one switch that selectively couples and decouples the offset correction circuit and the main amplifier circuit.

19. A method of performing offset cancellation in an amplification circuit, the method comprising:
- utilizing a two-phase output sampler to sample an output of a main amplifier circuit in both a first clock phase and a second clock phase, wherein the main amplifier circuit operates in a sample mode in the first clock phase, and wherein the main amplifier circuit operates in a hold mode in the second clock phase;
- determining a difference between the sampled output of the main amplifier circuit during the first clock phase and the sampled output of the main amplifier circuit during the second clock phase; and
- using the determined difference to generate an offset correction feedback that is provided to the main amplifier circuit, thereby reducing or eliminating the offset produced by the main amplifier circuit in both the sample and hold mode.

20. The method of claim 19, wherein the main amplifier circuit comprises at least one of a Digital-to-Analog Converter (DAC), an Analog-to-Digital Converter (ADC), and a voltage amplifier.

* * * * *